United States Patent
Son et al.

(10) Patent No.: US 7,259,643 B2
(45) Date of Patent: Aug. 21, 2007

(54) TUNABLE WIDEBAND BANDPASS FILTER, TUNABLE MULTI-BAND BANDPASS FILTER USING THE SAME, AND METHODS THEREFORE

(75) Inventors: Mi-hyun Son, Seoul (KR); Seong-soo Lee, Suwon-si (KR); Kwy-ro Lee, Daejeon (KR); Min-kyung Lee, Jeongeub-si (KR); Ick-jin Kwon, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 237 days.

(21) Appl. No.: 11/062,600

(22) Filed: Feb. 22, 2005

(65) Prior Publication Data

US 2005/0184828 A1    Aug. 25, 2005

(30) Foreign Application Priority Data

Feb. 21, 2004  (KR) ...................... 10-2004-0011670

(51) Int. Cl.
    *H03H 7/00* (2006.01)
(52) U.S. Cl. .................. 333/174; 333/167; 333/185
(58) Field of Classification Search ............... 333/167, 333/174, 175, 185; 331/117 R, 167
    See application file for complete search history.

(56) References Cited

U.S. PATENT DOCUMENTS

| | | | | |
|---|---|---|---|---|
| 2,325,174 | A | * | 7/1943 | Arthur .......................... 334/47 |
| 2,496,177 | A | * | 1/1950 | Edward et al. ................ 334/47 |
| 6,750,734 | B2 | * | 6/2004 | Utsunomiya et al. ....... 333/17.1 |

* cited by examiner

Primary Examiner—Robert Pascal
Assistant Examiner—Kimberly E Glenn
(74) Attorney, Agent, or Firm—Staas & Halsey LLP

(57) ABSTRACT

A tunable wideband bandpass filter that can digitally vary the center frequency and bandwidth of a signal to be filtered, and includes a plurality of switched-capacitor banks for varying capacitance and converting the center frequency and bandwidth into a digital signal, and a plurality of inductors provided for inductance to generate the center frequency, the plurality of switched-capacitor banks that may be integrated into a signal chip.

25 Claims, 6 Drawing Sheets

TUNABLE WIDEBAND BANDPASS FILTER, TUNABLE MULTI-BAND BANDPASS FILTER USING THE SAME, AND METHODS THEREFORE

CROSS-REFERENCE TO RELATED APPLICATION

This application claims benefit under 35 U.S.C. § 119 from Korean Patent Application No. 2004-11670, filed on Feb. 21, 2004, the content of which is incorporated herein by reference.

BACKGROUND OF THE INVENTION

1. Field of the Invention

The present invention relates to a frequency-tunable filter, and more particularly to digitally-controlled, small-sized, low power-consuming tunable wideband filter and tunable multi-band wideband filter using switched capacitors and inductors in use of the same, which are suitable for wideband communication systems and multi-mode communication systems.

2. Description of the Related Art

In general, frequency-tunable bandpass filters with freely variable center frequencies are required in wideband communication systems, such as television ("TV"), ultra high-band ("UWB"), and multi-mode communication systems, such as cellular phones, personal communication service ("PCS"), and wideband code-division multiple access ("WCDMA").

FIG. 1 is a block diagram showing a communication system of a conventional RF receiver. In FIG. 1, an RF band signal received through an antenna is input to an RF bandpass filter 10. The RF bandpass filter 10 filters the signal of the antenna to a wireless frequency band, and outputs the filtered signal to a low-noise amplifier (LNA) 20. The low-noise amplifier 20 receives a signal output from the RF bandpass filter 10, low-noise-amplifies the signal by a predetermined gain, and outputs the amplified signal to a mixer 30. The mixer 30 mixes the signal of the low-noise amplifier 20 with a sinusoidal signal generated from a local oscillator, and outputs a signal having a center frequency $f_{IF}$ shifted in a center frequency band. The signal of the mixer 30 is input to the base band modem 60 through an intermediate frequency filter 40 and an intermediate frequency/automatic gain control amplifier 50.

As such, the conventional RF receiver has the RF bandpass filter 10 with fixed frequency characteristics.

FIG. 2 illustrates a general multi-band and multi-mode receiver that switches receivers fit to a band and mode. Thus, the multi-band and multi-mode receiver requires additional receivers and space.

The development of integration circuit ("IC") technology is facilitating the implementation of wideband low noise amplifiers ("LNAs") and local oscillators. As shown in FIG. 3, a frequency-tunable radio frequency ("RF") bandpass filter enables a single receiver to serve as a multi-band and multi-mode receiver.

The frequency-tunable RF bandpass filter enables a user to select a desired RF band channel. The frequency-tunable RF bandpass filter removes interference signals outside of the desired band and interference signals caused by neighboring channels which alleviates the linear characteristics required for an RF circuit and the phase-noise requirements of a local oscillator so that power consumption is reduced.

As previously discussed, the conventional frequency-tunable bandpass filter is constructed in the hybrid form using a varactor diode controlled by an analog tuning signal or a pin diode switch. However, the conventional frequency-tunable bandpass filter described above has severe non-linear characteristics, a large size, increased power consumption, and is costly.

On the other hand, a frequency-tunable RF bandpass filter using only active elements is easily controlled; however, it consumes a lot of power, has a low yield, and performs worse than the passive filter in terms of linearity or noise factor. As such, the frequency-tunable bandpass filter using only active elements is difficult to apply to the wideband communication systems or multi-mode communication systems.

SUMMARY OF THE INVENTION

An aspect of the invention provides an on-complimentary metal-oxide semiconductor (CMOS) chip, digitally-controlled, small-sized, low power-consuming tunable wideband bandpass filter and tunable multi-band wideband bandpass filter using the same.

The foregoing and/or other objects and advantages are substantially realized by providing a tunable wideband bandpass filter capable of varying a center frequency and bandwidth of a signal to be filtered, comprising a plurality of switched-capacitor banks (SCBs) for varying capacitance and converting the center frequency and bandwidth into a digital signal; and a plurality of inductors provided for inductance to generate the center frequency, wherein the plurality of switched-capacitor banks (SCBs) are integrated into a signal chip.

According to an aspect of the invention, the chip is formed of complementary metal oxide semiconductor.

According to an aspect of the invention, the plurality of inductors are preferably integrated into the chip.

According to an aspect of the invention, the plurality of inductors are preferably implemented as individual elements or in a hybrid form outside of the chip.

According to an aspect of the invention, the switched-capacitor banks each include a plurality of switched capacitors connected in parallel, and a plurality of switching elements respectively connected in series to the plurality of switched capacitors.

According to an aspect of the invention, the switched-capacitor banks further include a varactor diode, respectively, connected in parallel with the plurality of switched capacitors and switching elements.

According to an aspect of the invention, an equivalent capacitance of the switched-capacitor banks preferably varies by turning on or off the plurality of switching elements.

According to an aspect of the invention, the plurality of switching elements are metal oxide semiconductor transistors.

According to an aspect of the invention, the plurality of switching elements are micro electro mechanical system (MEMS) switches.

According to an aspect of the invention, a tunable multi-band wideband bandpass filter capable of varying a center frequency and bandwidth of a signal to be filtered, may include: a plurality of switched-capacitor banks for varying capacitance and converting the center frequency and bandwidth into a digital signal; a plurality of switched inductors for varying inductance and converting the center frequency and bandwidth into a digital signal; and a plurality of switches for switching the plurality of switched inductors, wherein the plurality of switched-capacitor banks and switches are integrated into a single chip, and the plurality of switched inductors are connected in parallel with the switched capacitors.

According to an aspect of the invention, the plurality of switched inductors are implemented as individual elements or in a hybrid form outside of the chip.

According to an aspect of the invention, the plurality of switched inductors are integrated into the chip.

According to an aspect of the invention, the chip is formed of Complementary Metal Oxide Semiconductor (CMOS).

According to an aspect of the invention, the switched-capacitor banks each include a plurality of switched capacitors connected in parallel and a plurality of switching elements respectively connected in series to the plurality of switched capacitors.

According to an aspect of the invention, the switched-capacitor banks each further includes a varactor diode connected in parallel with the plurality of switched capacitors and switching elements.

According to an aspect of the invention, an equivalent capacitance of the switched-capacitor banks preferably varies by turning on or off the plurality of switching elements.

According to an aspect of the invention, the plurality of switching elements are Metal Oxide Semiconductor (MOS) transistors.

According to an aspect of the invention, the plurality of switching elements are micro electro mechanical system (MEMS) switches.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
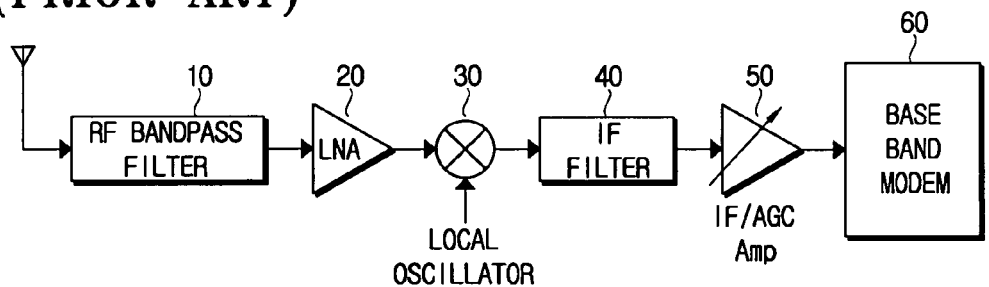
FIG. 1 is a block diagram illustrating a communication system using a conventional RF receiver.
Figure 2:
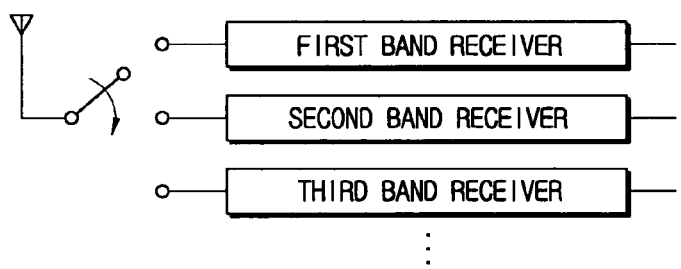
FIG. 2 illustrates operations of a conventional multi-band and multi-mode receiver.
Figure 3:
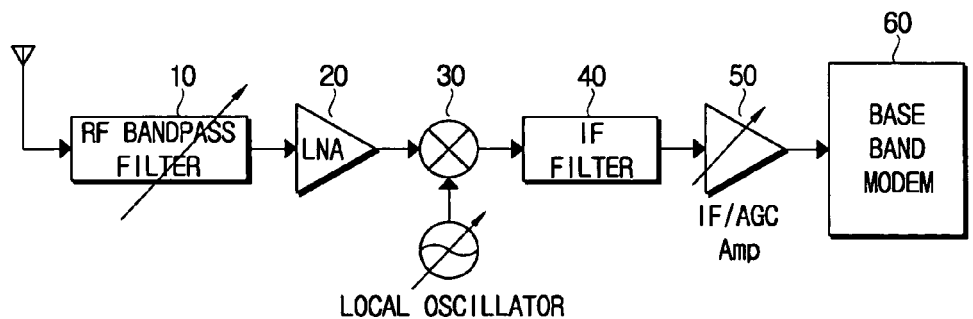
FIG. 3 is a block diagram illustrating a communication system having a multi-band and multi-mode receiver as a receiver using a frequency-tunable radio frequency band.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 4:
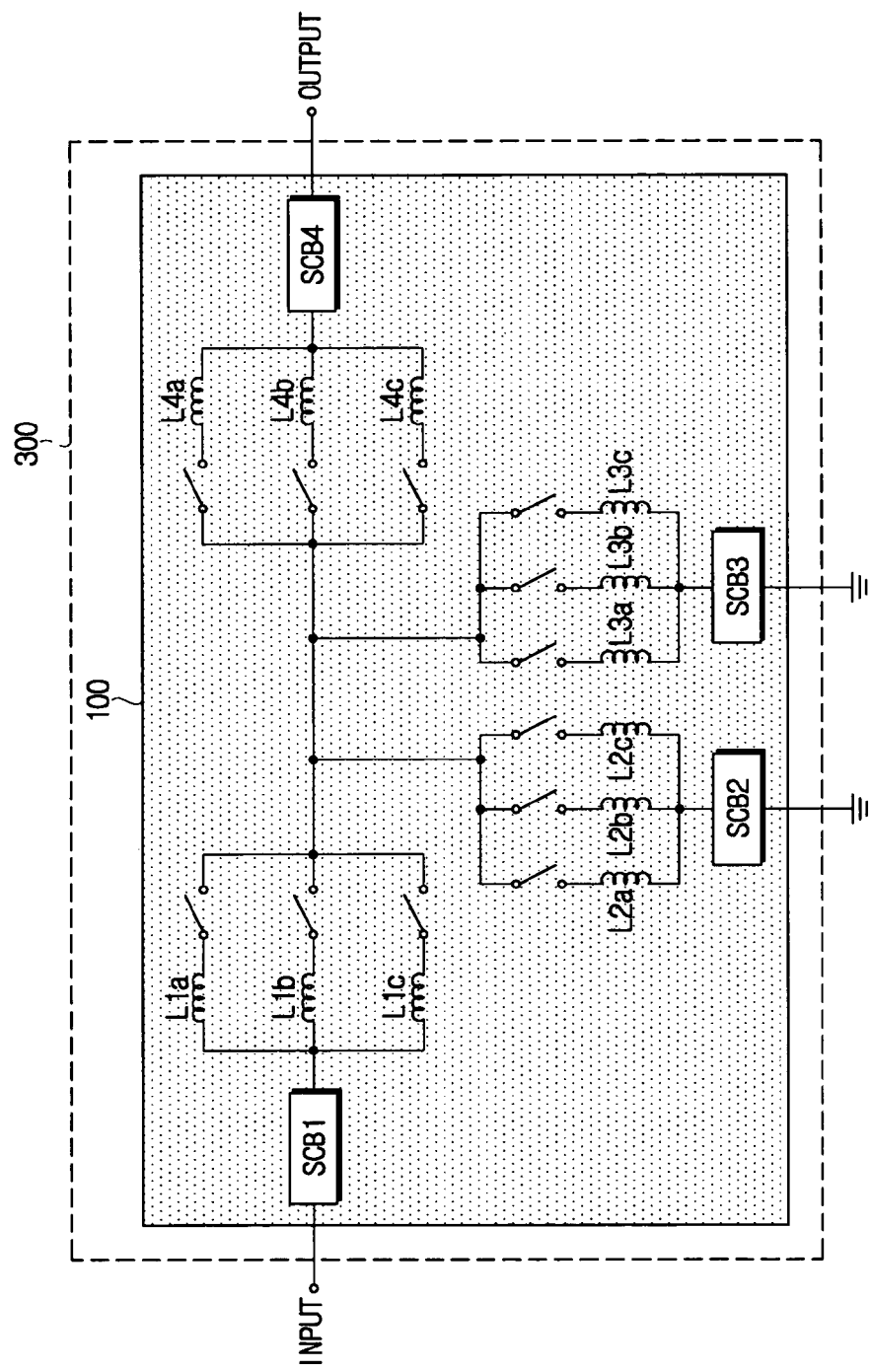
FIG. 4 is an illustration of a tunable multi-band wideband bandpass filter according to an embodiment of the invention.

FIG. 4 is an illustration of a structure of a tunable multi-band wideband bandpass filter according to an embodiment of the invention. In FIG. 4, a tunable multi-band wideband bandpass filter 300 has a plurality of switched-capacitor banks ("SCB") SCB1, SCB2, SCB3, and SCB4 and a plurality of switched-inductor banks (L1a, L1b, and L1c), (L2a, L2b, and L2c), (L3a, L3b, and L3c), and (L4a, L4b, and L4c), respectively integrated on a side of a CMOS chip 100. For example, the plurality of SCBs and switched-inductor banks are provided on an upper side of the CMOS chip 100. The capacitors and inductors are switched in order to improve the performance of the filter by expanding the tuning range of the filter.

The first switched-capacitor bank SCB1 is connected with a plurality of switched inductors L1a, L1b, and L1c that are connected in parallel, and the other ends of the switched inductors L1a, L1b, and L1c are connected in series to a switch respectively to turn the switched inductors L1a, L1b, and L1c on or off. Likewise, the second, third, and fourth switched-capacitor banks SCB2, SCB3, and SCB4 are connected to switched inductors L2a to L2c, L3a to L3c, and L4a to L4c, respectively, which are connected in parallel with one another, and the other ends of the switched inductors L2a to L2c, L3a to L3c, and L4a to L4c are connected in series to a switch, respectively.

The tunable multi-band wideband bandpass filter switching on and off the inductors structured as above controls the equivalent capacitance of a circuit by the switched-capacitor banks SCB1 to SCB4 and the equivalent inductance of a circuit by turning on and off the switches of the switched inductors, to enable bandwidth extension.

Figure 5:
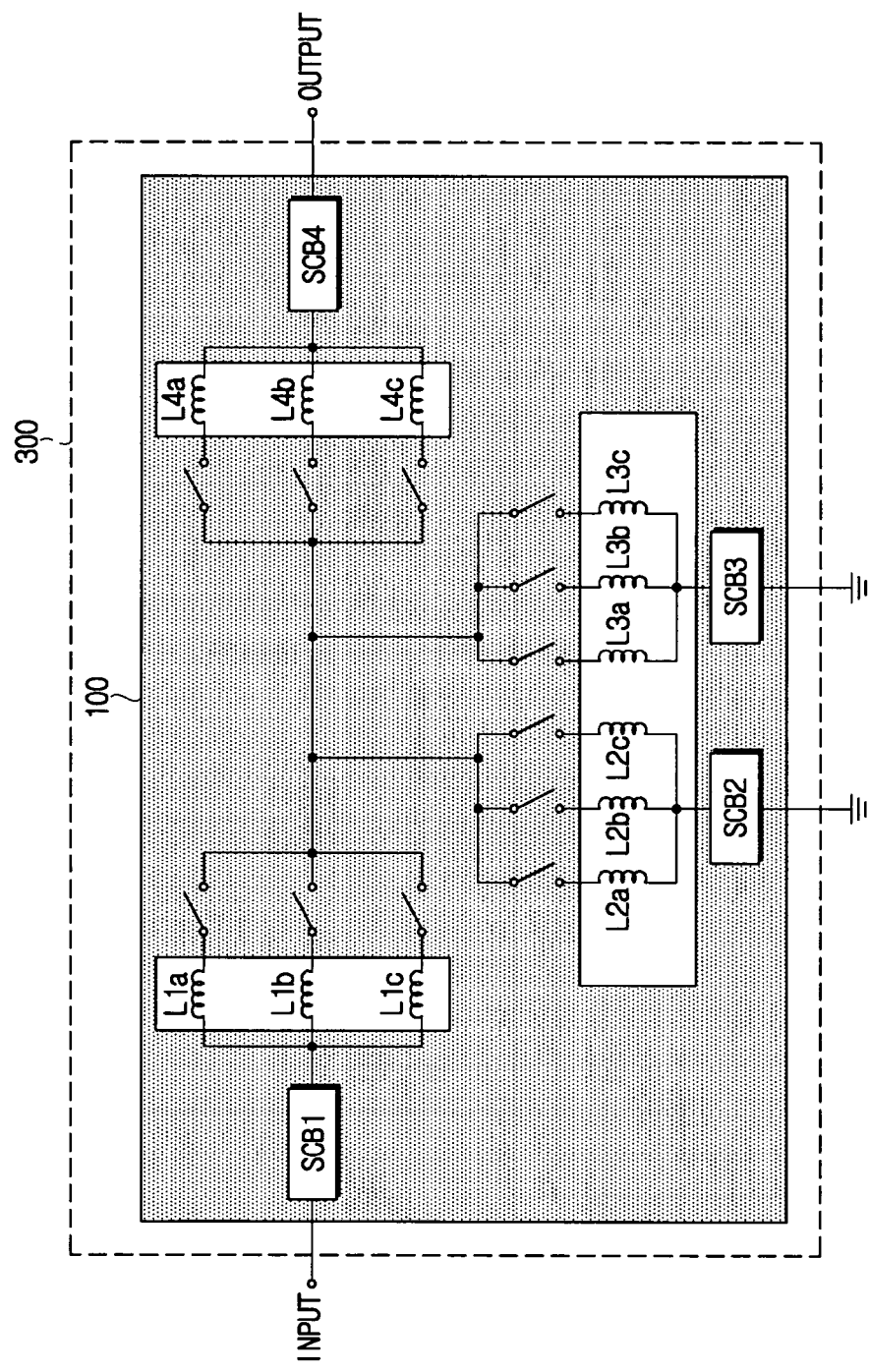
FIG. 5 is an illustration of a tunable multi-band wideband bandpass filter according to another embodiment of the invention.

FIG. 5 is a view of the tunable multi-band wideband bandpass filter according to an embodiment of the invention. In FIG. 5, when a high quality factor is required, the inductors L1a to L1c, L2a to L2c, L3a to L3c, and L4a to L4c are preferably implemented as individual elements or in a hybrid form outside of the CMOS chip 100.

Figure 6:
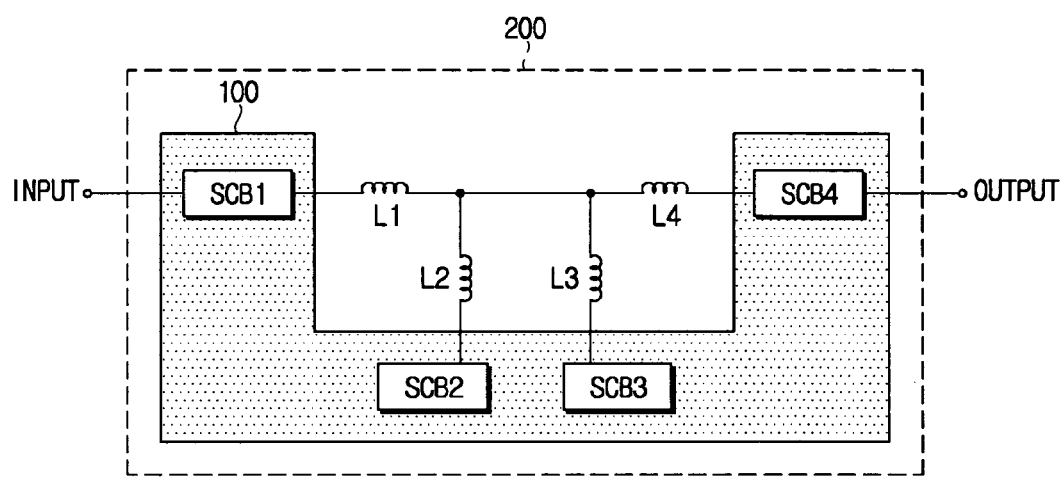
FIG. 6 is an illustration of a tunable wideband bandpass filter according to an embodiment of the present invention.

FIG. 6 is a view of a tunable wideband bandpass filter according to an aspect of the invention. In FIG. 6, the tunable wideband bandpass filter 20 has a plurality of switched-capacitor banks SCB1, SCB2, SCB3, and SCB4 integrated on a side of the CMOS chip 100 and a plurality of inductors L1, L2, L3, and L4 implemented outside of the CMOS chip 100. For example, the plurality of SCB's are provided on an upper side of the CMOS chip 100. In order to reduce the deterioration of the quality factor of the switched inductors due to the resistance component of the switches and the number of pads for the inductor switches, external inductors L1 to L4 without a switch have to be used. However, when the high quality factor is not required, the inductors L1 to L4 are preferably integrated in the form of a spiral inductor into the CMOS chip 100.

As seen in the embodiment illustrated in FIG. 6, the first switched-capacitor bank SCB1 is connected in series to one end of the first inductor L1, and the other end of the first inductor L1 is connected to additional inductors L2, L3, and L4, wherein L1 through L4 are connected in parallel with one another. Further, the other end of the second inductor L2 is connected in series to the second switched-capacitor bank SCB2, and the other end of the second switched capacitor bank SCB2 is grounded. The other end of the third inductor L3 is connected in series to the one end of the third switched-capacitor bank SCB3, and the other end of the third switched-capacitor bank SCB3 is grounded. The other end of the fourth inductor L4 is connected in series to the one end of the fourth switched-capacitor bank SCB4.

An RF analog signal applied to the first switched-capacitor bank SCB1 through an input terminal is tuned to a center frequency and a bandwidth, and then output throughout a low-noise amplifier through the fourth switched-capacitor bank SCB4. The present embodiment is not limited to four SCBs and four inductors. For example, an RF analog signal applied to SCB1 may be output to a low noise amplifier 20 through a fifth SCB.

Figure 7:
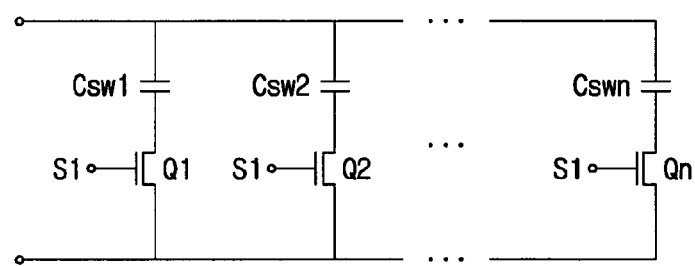
FIG. 7 is an illustration of an internal circuit of a switched-capacitor bank of the tunable wideband bandpass filter of FIG. 6.

FIG. 7 is a view of the internal circuit of the switched-capacitor banks SCB1 to SCB4 according to an embodiment of the invention. In FIG. 7, the switched-capacitor banks SCB1 through SCB4 each have n switched capacitor C1, C2, ..., and Cn, with one end of each switched capacitor being connected in parallel with the input terminal, and with the other end of each switched capacitor being is connected in series to n transistors Q1, Q2, ..., and Qn. The transistors Q1 to Qn may include metal oxide semiconductor (MOS) transistors and micro electro mechanical system (MEMS) switch elements.

According to an embodiment of the invention, the gate of each transistor is applied with a digital control signal Si consisting of bits, and the transistor properly controls the digital control signal Si, in order to convert the capacitance of the switched capacitors C1 to Cn into a digital signal. Thus, the entire capacitance of the tunable wideband bandpass filter 200 is controlled.

Equation 1 shows the relationship among capacitance, inductance, and a center frequency, according to an embodiment of the invention:

$$f_r = \frac{1}{2\pi\sqrt{LC}},\qquad\text{[Equation 1]}$$

In Equation 1, fr denotes the center frequency, L is an equivalent inductance of the tunable wideband bandpass filter, and C is an equivalent capacitance of the tunable wideband bandpass filter.

As described above, when the equivalent capacitance of the tunable wideband bandpass filter is controlled, the center frequency of the signal applied to the tunable wideband bandpass filter and the signal bandwidth can be adjusted.

Figure 8:
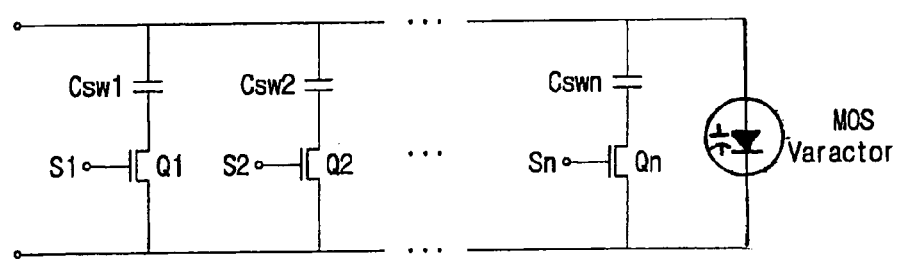
FIG. 8 is an illustration of a switched capacitor bank having a varactor diode according to an embodiment of the invention.

FIG. 8 illustrates an embodiment of the present invention having a switched-capacitor bank SCB with a varactor diode. As shown in FIG. 8, the varactor diode is connected in parallel with a plurality of switched capacitors Csw1, Csw2, ..., and Cswn and a plurality of transistors Q1, Q2, ..., and Qn. The plurality of transistors are MEMS switch elements.

The addition of the varactor diode enables the equivalent capacitance of the respective switched-capacitor banks SCB1 to SCB4 to be more precisely controlled. For example, the varactor diode enables fine frequency tuning to be achieved.

As described above, the transistors are turned on or off when digital control signal voltages are set lower or higher than a predetermined threshold voltage of the transistors, which enables the entire capacitance of the respective switched-capacitor banks SCB1 to SCB4 to be adjusted. For example, when the capacitance of the respective switched-capacitor banks SCB1 to SCB4 is adjusted as described above, the center frequency and bandwidth of an RF analog signal applied to the filter can be adjusted.

Figure 9:
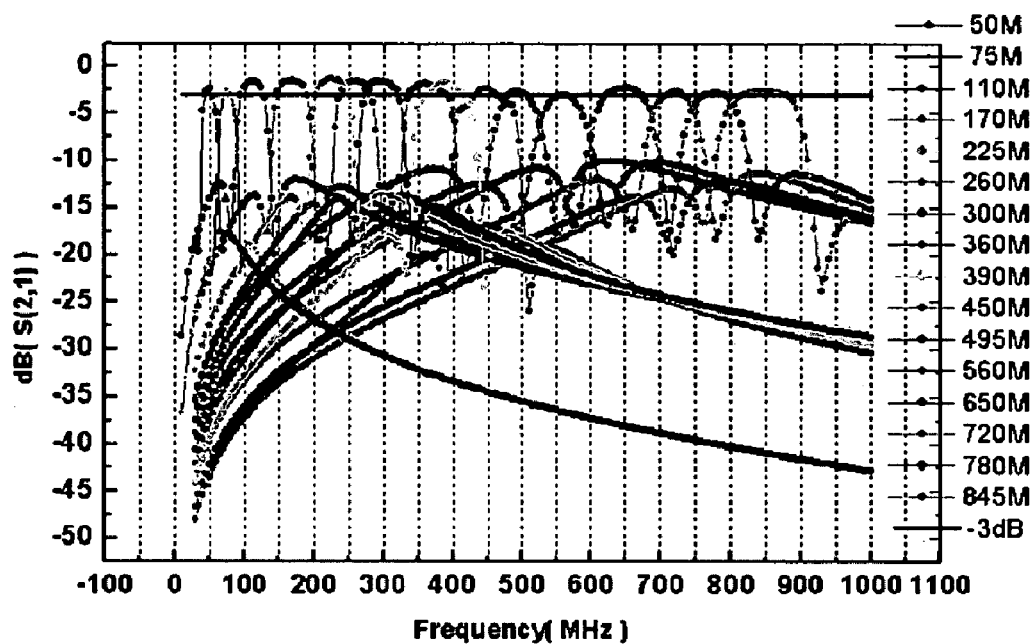
FIG. 9 is an illustration of a simulation result for the tunable multi-band wideband bandpass filter shown in FIG. 4.

FIG. 9 illustrates a simulation for the tunable multi-band wideband bandpass filter shown in FIG. 4. As shown in FIG. 9, the values of the switched inductors are set in order for three bands to have center frequencies between 50 MHz and 110 MHz, 110 MHz and 500 MHz, and 500 MHz and 900 MHz, respectively. The tunable multi-band wideband bandpass filter varies its band range from 50 MHz to 900 MHz as shown in the simulation result.

Figure 10:
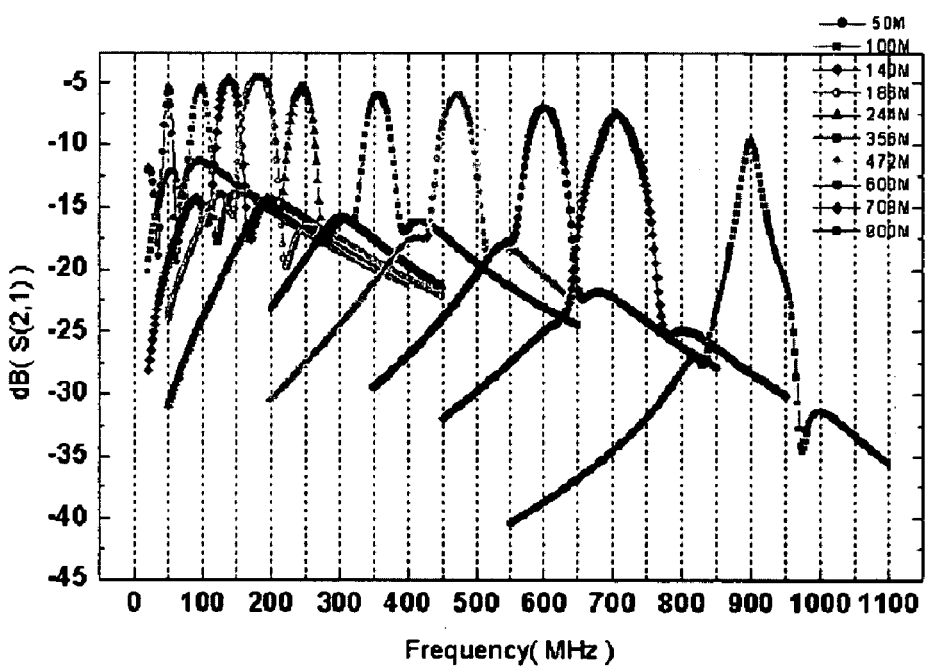
FIG. 10 is an illustration of a simulation result for the tunable wideband bandpass filter shown in FIG. 6.

FIG. 10 illustrates a simulation result for the tunable wideband bandpass filter shown in FIG. 6. In FIG. 10, the tunable wideband bandpass filter varies its center frequency from 50 MHz to 900 MHz as shown in the simulation result.

As discussed above, the invention can implement a digitally controlled, small-sized, low power-consumed, and manufacturing cost-lowered tunable wideband bandpass filter.

Further, the invention improves the performance of a tunable multi-band wideband bandpass filter since the bandwidth of the filter can be widened.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A tunable wideband bandpass filter adjusting a center frequency and bandwidth of a signal to be filtered, comprising:
    a plurality of switched-capacitor banks adjusting capacitance and converting the center frequency and bandwidth for an output digital signal; and
    a plurality of inductors providing inductance to generate the center frequency,
    wherein the plurality of switched-capacitor banks are integrated into a single chip, and
    the switched-capacitor banks comprise:
        a plurality of switched capacitors connected in parallel;
        a plurality of switching elements respectively connected in series to the plurality of switched capacitors; and
    a varactor diode connected in parallel with the plurality of switched capacitors and switching elements.

2. The tunable wideband bandpass filter of claim 1, wherein the chip is made of a complementary metal oxide semiconductor material.

3. The tunable wideband bandpass filter of claim 1, wherein the plurality of inductors are implemented as individual elements outside of the single chip.

4. The tunable wideband bandpass filter of claim 1, wherein the plurality of inductors are implemented in a hybrid form outside of the single chip.

5. The tunable wideband bandpass filter of claim 1, wherein an equivalent capacitance of the switched-capacitor banks is adjusted by switching the plurality of switching elements.

6. The tunable wideband bandpass filter of claim 1, wherein the plurality of switching elements are metal oxide semiconductor transistors.

7. The tunable wideband bandpass filter as claimed in claim 1, wherein the plurality of switching elements are micro electro mechanical system switches.

8. A tunable wideband bandpass filter adjusting a center frequency and bandwidth of a signal to be filtered, comprising:
   a plurality of switched-capacitor banks adjusting capacitance and converting the center frequency and bandwidth for an output digital signal; and
   a plurality of inductors providing inductance to generate the center frequency,
   wherein the plurality of switched-capacitor banks and the plurality of inductors are integrated into a single chip.

9. A tunable multi-band wideband bandpass filter adjusting a center frequency and bandwidth of a signal to be filtered, comprising:
   a plurality of switched-capacitor banks adjusting capacitance of a circuit;
   a plurality of switched inductors, connected with the plurality of switched-capacitor banks, adjusting inductance of the circuit such that the center frequency and bandwidth of the signal are converted for an output digital signal according to the adjusted capacitance and inductance of the circuit; and
   a plurality of switches switching the plurality of switched inductors, wherein the plurality of switched-capacitor banks and switches are integrated into a single chip and the plurality of switched inductors are connected in parallel with the switched capacitors,
   wherein the switched-capacitor banks comprise:
      a plurality of switched capacitors connected in parallel;
      a plurality of switching elements respectively connected in series to the plurality of switched capacitors; and
      a varactor diode connected in parallel with the plurality of switched capacitors and switching elements.

10. The tunable multi-band wideband bandpass filter of claim 9, wherein the plurality of switched inductors are implemented as individual elements outside of the single chip.

11. The tunable multi-band wideband bandpass filter of claim 9, wherein the plurality of switched inductors are implemented in a hybrid form outside of the single chip.

12. The tunable multi-band wideband bandpass filter of claim 9, wherein the chip is formed of a complementary metal oxide semiconductor.

13. The tunable multi-band wideband bandpass filter of claim 9, wherein an equivalent capacitance of the switched-capacitor banks varies according to a switched state of the plurality of switching elements.

14. The tunable multi-band wideband bandpass filter of claim 9, wherein the plurality of switching elements are metal oxide semiconductor transistors.

15. The tunable multi-band wideband bandpass filter of claim 9, wherein the plurality of switching elements are micro electro mechanical system switches.

16. A tunable multi-band wideband bandpass filter adjusting a center frequency and bandwidth of a signal to be filtered, comprising:
   a plurality of switched-capacitor banks adjusting capacitance of a circuit;
   a plurality of switched inductors, connected with the plurality of switched-capacitor banks, adjusting inductance of the circuit such that the center frequency and bandwidth of the signal are converted for an output digital signal according to the adjusted capacitance and inductance of the circuit; and
   a plurality of switches switching the plurality of switched inductors, wherein the plurality of switched-capacitor banks, the plurality of switched inductors and switches are integrated into a single chip and the plurality of switched inductors are connected in parallel with the switched capacitors.

17. A frequency-tunable filter for wideband communication systems, comprising:
   a plurality of switched inductors respectively connected in parallel with a plurality of switched capacitor banks to adjust an equivalent capacitance of the frequency-tunable filter such that an input signal is tuned to a center frequency for an output signal,
   wherein the plurality of switched capacitor banks switch on and off according to a measured voltage of the input signal.

18. The frequency-tunable filter of claim 17, wherein the plurality of switched-capacitor banks are integrated into a single chip.

19. The frequency-tunable filter of claim 18, wherein the entire capacitance of the plurality of switched-capacitor banks is adjusted according to the measured voltage of the input signal such that when the capacitance of the plurality of switched capacitor banks is adjusted the center frequency and bandwidth of the input signal is adjusted.

20. The frequency-tunable filter of claim 19, wherein the center frequency and/or bandwidth of the input signal is adjusted according to the equivalent capacitance of the frequency-tunable filter and in accordance with the following equation:

$$f_r = \frac{1}{2\pi\sqrt{LC}},$$

wherein fr denotes the center frequency of the input signal, L is an equivalent inductance of the frequency-tunable filter, and C is an equivalent capacitance of the frequency-tunable filter.

21. The frequency-tunable filter of claim 20, wherein the plurality of switched-capacitor banks and the plurality of switched inductors are integrated into the single chip.

22. A method of adjusting a center frequency and bandwidth of a signal filtered by a frequency-tunable filter for wideband communication systems, comprising:
   switching a plurality of inductors respectively connected in parallel with a plurality of switched-capacitor banks to adjust an equivalent capacitance of a circuit and enable bandwidth extension of the signal,
   wherein an entire capacitance of the plurality of switched-capacitor banks is adjusted when the capacitors are switched, and
   the center frequency and/or bandwidth of the signal is adjusted according to the equivalent capacitance of the frequency-tunable filter in accordance with the following equation:

$$f_r = \frac{1}{2\pi\sqrt{LC}},$$

where fr denotes the center frequency of the input signal, L is an equivalent inductance of the frequency-tunable filter, and C is an equivalent capacitance of the frequency-tunable filter.

23. The method of adjusting the center frequency and bandwidth of the signal of claim 22, wherein the center frequency and bandwidth of the signal are adjusted when the inductors are switched.

24. The method of adjusting the center frequency and bandwidth of the signal of claim 22, further comprising:

individually switching each of the plurality of inductors grouped together and corresponding to the switched capacitor bank for precisely adjusting the center frequency and bandwidth of the signal, the plurality of inductors grouped together are connected in parallel with each other and in series with the corresponding switched capacitor bank.

25. A method of forming a frequency-tunable filter on a chip, comprising:

forming a plurality of switched-capacitor banks on a side of the chip to adjust capacitance of an input signal; and forming a plurality of inductors, connected in series with the plurality of switched-capacitor banks, on the chip to adjust the inductance of the input signal;

wherein the input signal is applied to a first switched-capacitor bank through an input terminal, tuned to a center frequency and a bandwidth according to the adjusted capacitance and inductance, and then output to a low-noise amplifier through another switched-capacitor bank.

* * * * *

UNITED STATES PATENT AND TRADEMARK OFFICE
CERTIFICATE OF CORRECTION

PATENT NO. : 7,259,643 B2  Page 1 of 1
APPLICATION NO. : 11/062600
DATED : August 21, 2007
INVENTOR(S) : Mi-hyun Son et al.

It is certified that error appears in the above-identified patent and that said Letters Patent is hereby corrected as shown below:

Title Page, Item (54) Title: after "MULTI-BAND" insert --WIDEBAND--.

Column 1, Line 2, after "MULTI-BAND" insert --WIDEBAND--.

Signed and Sealed this

Eighteenth Day of December, 2007

JON W. DUDAS
*Director of the United States Patent and Trademark Office*